(12) United States Patent
Crook et al.

(10) Patent No.: US 6,636,061 B1
(45) Date of Patent: Oct. 21, 2003

(54) METHOD AND APPARATUS FOR CONFIGURABLE HARDWARE AUGMENTED PROGRAM GENERATION

(75) Inventors: David T Crook, Loveland, CO (US); John Elliott McDermid, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/192,260

(22) Filed: Jul. 10, 2002

(51) Int. Cl.[7] .............................................. G01R 31/02
(52) U.S. Cl. ...................... 324/755; 324/158.1; 324/761
(58) Field of Search ................................. 324/755, 754, 324/761, 765, 158.1, 758; 439/66, 71, 700; 29/850, 842, 846, 825

(56) References Cited

U.S. PATENT DOCUMENTS 6,525,551 B1 * 2/2003 Beaman et al. ............. 324/754
6,530,148 B1 * 3/2003 Kister ......................... 29/842
6,541,991 B1 * 4/2003 Hornchek et al. .......... 324/755

* cited by examiner

Primary Examiner—Kamand Cuneo
Assistant Examiner—Jimmy Nguyen

(57) ABSTRACT

A method and apparatus are disclosed for enabling reconfiguration of a test system. The test system includes an adapter assembly and a tester electronics assembly. The adapter assembly includes two probe plates, which hold a probe field. The two probe plates include a plurality of holes extending through each probe plate. Each hole includes a flange area for accommodating deflection of the probes, inserted in the holes extending through the probe plates. The flange area and the use of flexible probes facilitate a deflection and an offset of the probes in the probe plates. A tester assembly includes a plurality of wear pads on the topside of a printed circuit board. The wear pads positioned to engage the bottom end of the probes. Configurable logic elements located on the underside of the printed circuit board are used to generating and receive test-signals, depending on where the probes make contact with the wear pads on the printed circuit board.

4 Claims, 5 Drawing Sheets

METHOD AND APPARATUS FOR CONFIGURABLE HARDWARE AUGMENTED PROGRAM GENERATION

BACKGROUND OF THE INVENTION

1. Field of the Invention

This invention relates to electronic test systems. Specifically, the present invention relates to configurable electronic test systems.

2. Description of the Related Art

Modern electronics systems have become more complex. As a result, the systems used to test modern electronic systems have also become more complex. Conventional digital electronics are deployed in printed circuit boards (PCB) or integrated circuits. These printed circuit boards and integrated circuits include millions of digital components such as logical gates, memories such as latch arrays, etc. In addition, the electronic systems include millions of connections between the components to communicate signals. The connection between two components is referred to as a trace.

Test systems are used to test conventional printed circuit boards and integrated circuits. These test systems typically include an interface, known as a fixture, for interfacing with a device under test (DUT). In addition, test patterns and electrical signals are generated by tester electronics, which connected to the fixture. The DUT typically sits on top of the fixture and the fixture typically sits on top of the tester electronics.

Conventional test systems typically are characterized as wired test systems or wireless test systems. In a wired test system a number of interface boards are loaded in the fixture. One specific interface board known as a probe plate includes a pattern of holes for holding a number of probes. The probes provide an electrical pathway from the tester electronics, through the fixture, to the DUT. When the probes are placed in the holes the probes form a pattern known as a probe field. The probe field makes contact with the DUT on one side of the probes to create an electrical contact point between the probe and the DUT. The probe field is specific to the DUT. In a wired test system, wires are wrapped on the other end of the probes and are run to the tester electronics. In this way an electrical pathway is established between the tester electronics, across the wires, to the probes and then to the DUT.

In a wireless test system, in addition to the probe plate, an interface board populated with traces is placed in the fixture. The interface board is known as a wireless PCB. The topside of the wireless PCB is placed in contact with the end of the probes that were previously connected to the wires in the wired test system. A second set of probes then make contact with the underside of the wireless PCB on one end and with interface contacts in the electronic tester at the other end. As a result, an electrical pathway is once again established from the tester electronics, through the fixture, to the DUT. The first leg of the electronic pathway runs from interface points on the tester electronics, to the probes and to the underside of the wireless PCB. Current may then run across traces in the wireless PCB. In the second leg of the electronic pathway, the probes which contact the top-side of the wireless PCB extend upward in the fixture and make contact with the underside of the DUT.

The tester electronics include a mixture of hardware and software directed at generating test patterns, which will be transmitted through the fixture to the DUT. A reverse path is also established back to the tester electronics to receive the test pattern and determine whether the DUT passed or failed the test. Different types of software may be implemented when a tester is implemented. The software is implemented to operate with the hardware and configure the type of test that should be implemented. The software hardware configuration is static and typically does not accommodate changes in test patterns or sequences.

A class of conventional test electronics have developed known as automatic test equipment (ATE). An ATE is a mixture of software and hardware capable of automatically running testing sequences on a DUT. Controlled by software routines, an ATE may perform sophisticated pattern generation and analysis of returning test patterns. In addition, an ATE may make adjustments and alter testing based on the return test patterns.

An example of a common test used in conventional test systems (e.g. ATE) is a boundary-scan test. A boundary-scan may be used to find simple manufacturing faults such as an "open" on a DUT. To perform a full test on a DUT all devices pins must be tested. On a complex DUT this may create a significant hurdle since first the DUT must be thoroughly understood. In addition a specific test must be constructed and then debugged. For complex DUT's this may take weeks or months. A Boundary-scan provides a method to exercise pins on the DUT with a limited amount of effort.

In order to perform a boundary scan, circuitry is added to the standard logic function of the DUT. At a minimum this includes hardware known as a Test Access Port to control the boundary-scan operation. The test access receives a test clock (TCK) for providing timing information through the test access port and a test mode select (TMS) for selecting a test mode of operation. In addition, contact points known as boundary scan cells are connected to the DUT. Some of the boundary scan cells known as test data in (TDI) cells, are used to apply test patterns to the DUT. Other boundary scan cells known as test data out (TDO) cells are used to read out test patterns applied to the DUT. In addition, 4 or 5 extra control pins are also added to the DUT to control the boundary scan function.

The most basic boundary scan test is an external test. An external test verifies that the DUT input/output drivers are functional, the bond wires are intact and the digital components are properly soldered to the board. In an external test, data is scanned into the device serially through the TDI line, clocked around the boundary-scan cell chain and then applied to the outputs. The results are sampled by the ATE. Patterns are applied to the inputs of the DUT, captured by the input boundary cells and clocked out the TDO line. The results are sampled by the ATE. Past data has shown that if a DUT passes the external test, there is a high probability the DUT will function properly.

An internal test can be used to test the core logic of the DUT. The internal test has two parts. During the first part of the internal test a sequence of instructions are activated. An internal self-test is performed and after a prescribed number of clock cycles, the results are scanned out the TDO for verification. In the second part of the internal test instructions are performed which provide the means to shift static test patterns into the device through the boundary scan chain, apply to the static test patterns to the core logic and shift out the resultant pattern through the TDO for analysis by the ATE.

Boundary-scan testing may be applied to technologies (e.g. DUTs) that have multiple chip modules. In conventional devices, multiple chip modules may be connected in a chain. These multiple chip modules typically fall into two categories. The first category are Multi-chain modules that have access to an internal node and the second category are multi-chain modules that don't have access to internal nodes.

When there is internal node access, boundary scan cells may be connected around the perimeter of the multi-chain modules. In addition, boundary scan cells may be positioned on an internal interface of each multi-chain module. In this configuration, patterns may be scanned in serially (e.g. TDI) to the boundary cells on the perimeter of a first module in the multi-chain module and applied in parallel to internal boundary cells located between the first module and a second module. These patterns are then captured from boundary scan cells located on the perimeter of the second module in the chain and scanned out serially (e.g. TDO). As a result, connections internal to the board become controllable or visible through the boundary-scan.

Some conventional ATE systems provide the means to test a multi-chain module that include conventional logic (e.g. non-boundary-scan parts). In this scenario, patterns are scanned in serially through the appropriate boundary scan device and applied in parallel to the conventional logic. The output states are captured by other boundary scan devices, scanned out serially and verified by the ATE.

Conventional test systems are designed to accommodate a specific DUT. A fixture is designed to accommodate a specific DUT and the ATE is developed to test a specific DUT. For example, supposed that an ATE is configured to perform a boundary-scan on a multi-module chain. In addition, suppose one of the modules is connected into the chain after the initial configuration of the ATE. The additional module breaks the boundary-scan test into the testing of two chain segments. Each of which has to be tested separately.

As a result of the addition of the last module in the chain, three interconnections are formed from the perspective of the boundary scan test. Connections that occur between parts of the first chain segment, connections between parts of the second chain segment and interconnections between the first and the second chain segment. As a result, the ATE is forced to build three test suites, analyze the results of the three test suites and integrate the results in a format that is suitable for an end-user.

However, all of the test routes, the placement of the DUT and the design of the fixture that interfaces with the DUT are static. For example, a specific fixture has to be developed to test a multi-chain module with two modules. If a third module is added a new fixture configuration must be implemented to accommodate and test a multi-chain module with multiple modules. This often requires a new placement of probes, new probe plates and new test patterns generated from the tester electronics. In other words, this may require a significant design effort on the part of the testing engineer. For example, a new probe plate may have to be designed and developed. New software code may have to be developed to accommodate the new module that is added to the end of the chain.

In addition to the problems associated with performing test when the DUT configuration changes, there are also changes that may have to be made to accommodate different test. For example, short detection test, powered open detection test and connectivity verification test are all different types of test that may require reconfiguration of the tester including new or different software testing code or routines.

Performing the various reconfigurations and redesigns are time-consuming and cost the designer and ultimately the end-user.

Thus there is a need in the art for a test system that can accommodate different DUT testing scenarios. There is a need in the art for an easy way to generate testing sequences for a changing DUT. Lastly, there is a need in the art for a fixture technology that will integrate with a tester capable of changing test sequences based on changes to the DUT.

SUMMARY OF THE INVENTION

A re-configurable test system is presented. The test system includes an adapter assembly capable of engaging different contact points in a device under test. The test system also includes a tester assembly, which interfaces with the adapter assembly. The tester assembly includes configurable logic units, which are used to generate test signals to the different points of contact on the device under test.

In one embodiment of the present invention, a system comprises an adapter assembly comprising, a first probe plate capable of holding a probe in a first position and in a second position. A second probe plate positioned below the first probe plate, the second probe plate capable of holding the probe in the first position and in the second position and an electronics assembly interfacing with the adapter assembly. The electronics assembly comprising a printed circuit board having a topside and an underside. A first pad coupled on the topside of the printed circuit board, the first pad positioned to make contact with the probe in the first position. A second pad coupled on the topside of the printed circuit board, the second pad positioned to make contact with the probe in the second position. A first configurable logic unit coupled to the underside of the printed circuit board, the first configurable logic unit generating signals through the printed circuit board to the first pad, when the probe is in the first position and a second configurable logic unit coupled to the underside of the printed circuit board, the second configurable logic unit generating signals through the printed circuit board to the second pad when the probe is in the second position.

A system comprises an adapter assembly housing a plurality of probes capable of deflecting from a first position to a second position; and an electronics assembly interfacing with the adapter assembly, the electronics assembly comprising a plurality of configurable logic units, each of the plurality configurable logic units capable of generating a variety of test patterns for interfacing with the plurality of probes when the plurality of probes are in the first position and when the plurality of probes are in the second position.

An assembly comprises a first probe plate including a first hole extending through the first probe plate, the first hole extending through the first probe plate including a first flange area accommodating deflection of a probe; and a second probe positioned below the first probe plate, the second probe plate including a second hole extending through the second probe plate, the second hole extending through the second probe plate including a second flange area accommodating deflection of the probe, the second hole extending through the second probe plate aligning with the first hole aligning through the first probe plate; and a probe positioned in the first hole extending though the first probe plate and positioned in the second hole extending through the second probe plate, the probe capable of lateral movement by deflecting within the first flange area accommodating deflection of the probe and deflecting within the second flange area accommodating deflection of the probe.

An assembly comprises a printed circuit board having a topside and an underside; a first pad coupled to the topside of the printed circuit board, the first pad positioned to make contact with a probe in a first position; a second pad coupled to the topside of the printed circuit board, the second pad positioned to make contact with the probe in a second position; and a configurable logic unit coupled to the underside of the printed circuit board, the configurable logic unit generating signals through the printed circuit board to the first pad, when the probe is in the first position and generating signals through the printed circuit board to the second pad when the probe is in the second position.

An apparatus comprises a printed circuit board including a pad; a power source applying source voltage to the pad; a reference input carrying a reference voltage; and a comparator coupled to the power source and coupled to the reference input, the comparator generating an output in response to the source voltage and in response to the reference voltage.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
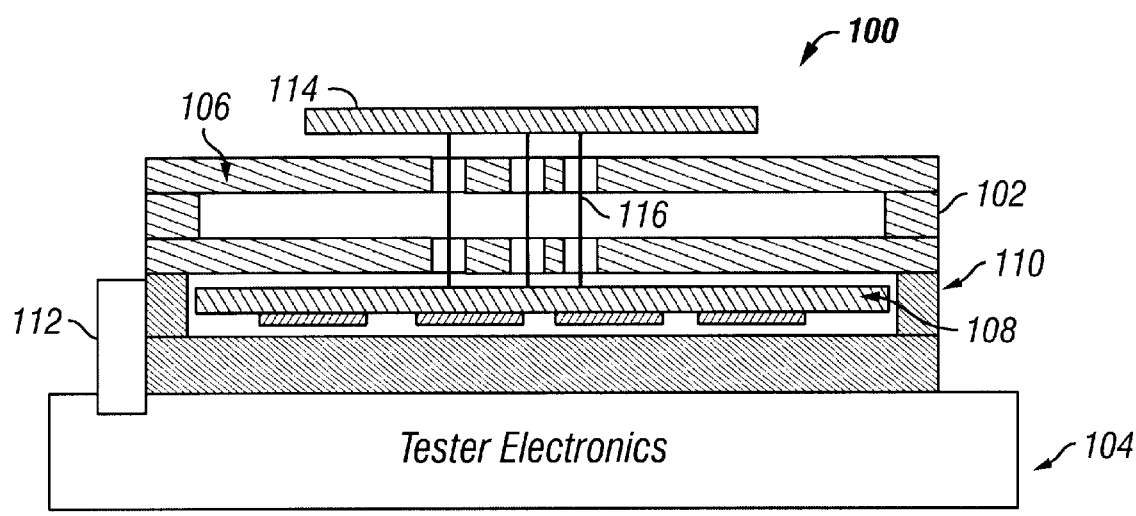
FIG. 1 displays an electronic test system implemented in accordance with the teachings of the present invention.

FIG. 1 displays an electronic testing system 100. The electronic testing system 100 includes a fixture assembly 102 and tester electronics 104. The fixture assembly 102 provides structural alignment for a device under test (DUT). The tester electronics 104 provides automatic test functionality such as signal pattern generation, receipt and analysis.

The fixture assembly 102 includes a prototype adapter assembly 106 positioned above a support assembly 110. The support assembly 110 provides support for the adapter assembly 106 and houses a test electronics assembly 108. The support assembly 110 is positioned above tester electronics 104. A performance port 112 connects to the test electronics assembly 108 through the support assembly 110. The performance port 112 provides power and control information between the tester electronics 104 and the test electronics assembly 108.

The fixture assembly 102 is specifically designed for each device under test. A device under test is shown as 114. The device under test is positioned above the adapter assembly 106. The adapter assembly 106 is specifically designed to mate with the device under test 114. Several probes shown as 116 penetrate the adapter assembly 106 and contact the device under test 114 on one end and the test electronics assembly 108 on the other end. The probes 116 provide an electronic pathway for test patterns generated from the tester electronics 104, through the test electronics assembly 108 to the device under test 114.

The adaptor assembly 106 includes a probe plate. The probe plate is a horizontal plate used to provide stability and positioning of the probes 116. In one embodiment of the present invention double-ended probes are used. A double-ended probe makes contact with the DUT 114 on one end and the test electronics assembly 108 on another end. As such, the double-ended probe provides and electrical pathway from the test electronics assembly 108 to the DUT 114.

Figure 2:
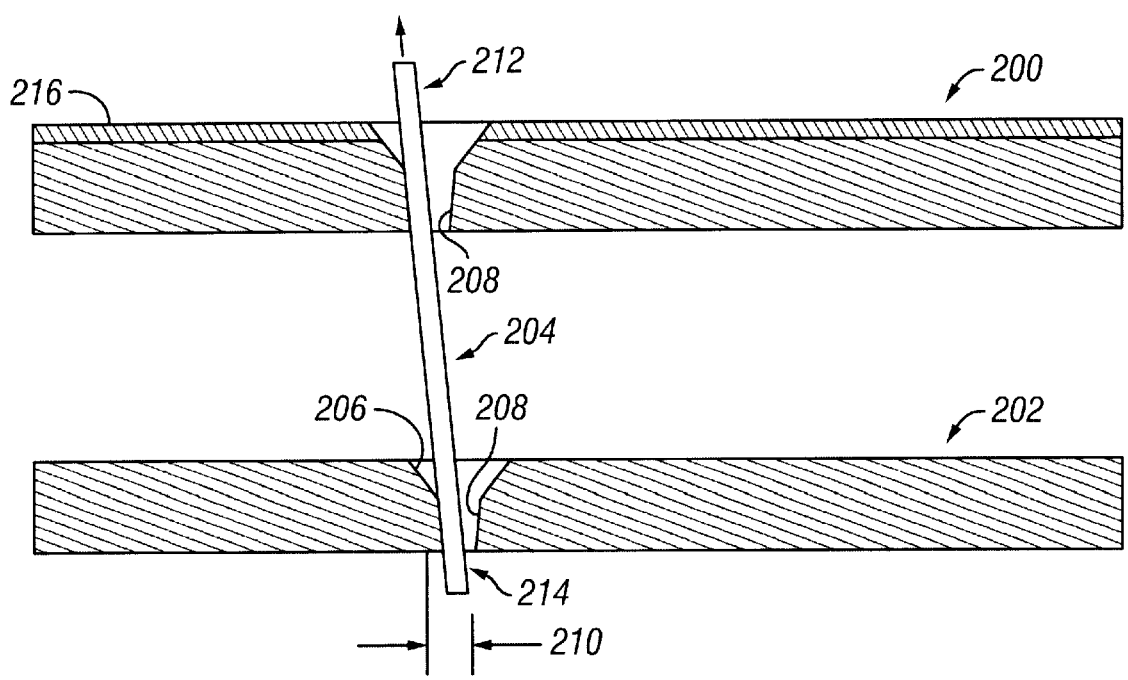
FIG. 2 displays an adapter assembly.

FIG. 2 is a drawing of the adaptor assembly 106 shown in FIG. 1. The adapter assembly includes a first probe plate 200 and the second probe plate 202. The first probe plate 200 includes a ground foil 216 for providing an electrical pathway to ground. The probe plates 200 and 202 each include a plurality of center drilled holes 208 for receiving and holding a probe shown as 204. The holes form a pattern (e.g. probe field) that is specific to the device under test (DUT). The probe plates are made of a composite material and may be drilled to hold a plurality of probe types.

The probe plates 200 and 202 are positioned relative to each other so that the probe field in the respective probe plates align. The first probe plate 200 is positioned above the second probe plate 202. The first probe plate will engage the upper portion of a probe and the second probe plate will engage a lower portion of the probe. Probes are fitted and held in both probe plates.

As mentioned above, each of the probe plate's 200 and 202 includes a plurality of hole patterns drilled to mate with a DUT. A number of probes such as 204 are placed in these holes. Once the probes are placed in the holes the probes form a probe field or probe pattern consistent with the hole pattern. The probes 212 may be placed and held in the center-drilled holes 208. In the alternative, the probes may be double socket probes with one socket mating with the first probe plate 200 and a second socket mating with the second probe plate 202.

The center-drilled holes are shown as 208. The center-drilled holes are formed in both the first probe plate 200 and the second probe plate 202. The hole pattern for the first probe plate 200 aligns with the hole pattern for the second probe plate 202. As a result, a probe such as 204, will fit into the holes of the first probe plate and then extend down through the center drilled holes 208 of the second probe plate 202. The probes 204 may be flexible probes, which bend or may be rigid probes. In addition, the probes may be double ended probes with a variety of probe tips in the end for making electrical contact. The probe 204 further extends beyond the probe plates as shown by 212 and 214 to make electrical contact on both ends. It should be appreciated that although specific probes are used in the present invention, a variety of probe types may be used and still remain within the scope of the teachings of the present invention.

A flange 206 is shown at the top of the center-drilled hole 208. The flange 206 allows a probe held in the center-drilled hole 208 to deflect in a horizontal direction. Since the probes extend beyond the probe plate as shown by a first protruding end 212 and a second protruding end 214; the holes 208 in combination with the flange area 212 enable the probe to deflect over an angle and have an offset as shown as 210. In one embodiment of the present invention, the offset will have a maximum of 0.071 inches. However, it should be appreciated that the offset may vary without departing from the scope or teachings of the present invention.

In the operation of the adaptor assembly (e.g. 106 FIG. 1) probes are placed in the center-drilled holes 208 and form a probe field. The probe field is specific to a device under test. The device under test would reside above the first probe plate and make contact with a probe at a first protruding end of the probe as shown by 212. The test electronic assembly (e.g. 108 FIG. 1) would make contact with a second protruding end of the probe 214.

A ground foil 216 is shown at the top of the first probe plate 200. The ground foil 216 is connected directly to the tester electronics (e.g. 104 FIG. 1) to provide a pathway to ground. As a result, ground is transferred from the plane on top of the fixture to the ground plane in the tester electronics.

During set-up the first probe plate 200 may be moved in a lateral or horizontal direction relative to the second probe plate 202. When the probe plates 200 and 202 are displaced in a horizontal direction relative to each other, the probe 204 deflects. The deflection results in an offset as shown by 210. The center drilled holes 208 and the flange areas 206 are designed such that the probe may experience the offset without being damaged. As the deflection occurs, the probe 204 shifts. The flange area provide enough room to accommodate the shift. Therefore, the combination of the drilled hole 208 which is drilled close enough to support the probe 204, the flange area 206 which provides enough room to allow the probe to deflect and the flexibility of the probe, enables the probe to move through an offset as shown by 210.

The ability to deflect the probes and move through an offset, enables the probes to make contact with different points on the device under test and the test electronics assembly. Should there be a need to move the probe and make contact with the device under test or the test electronics assembly at a new contact point; the method and apparatus of the present invention enables an operator to establish new contacts.

During fixture setup and design, when a plurality of probes are placed in the probe plates 200 and 202 a probe field is formed. With the method and apparatus of the present invention, the probe field may be shifted in a coordinated manner. As a result, a completely new test may be performed with minimal changes to the fixture or the test electronics. The readjustment of the probe plates will enable the probes to realign with new contact points in the device under test and in the test electronics assembly. As a result, new test patterns may be generated to perform additional test or the same test pattern may be generated to new test points or finally, comparison test may be made by running test at a first set of points and then running test at a second set of points.

Figure 3:
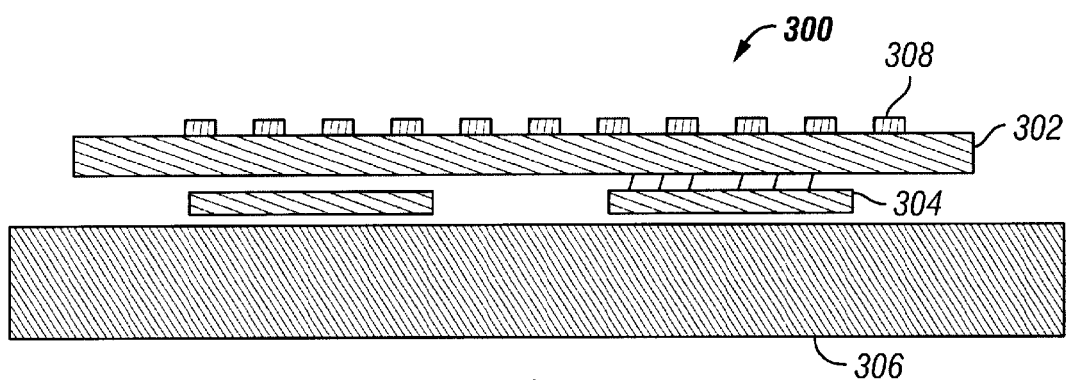
FIG. 3 displays a test electronics assembly.
Figure 4:
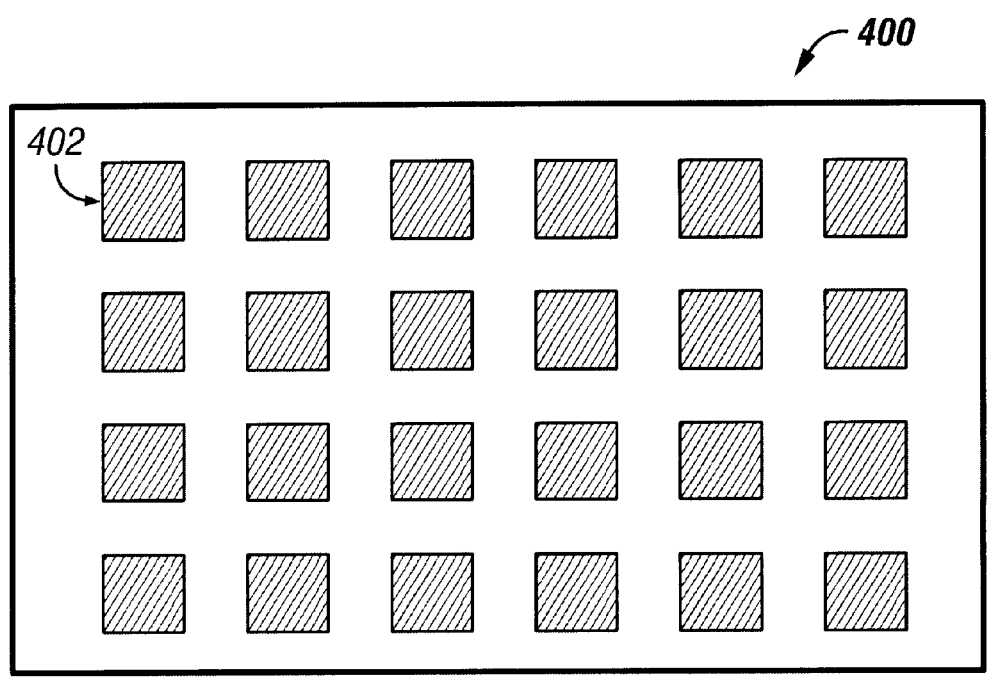
FIG. 4 displays a planer view of an array of configurable logic units.

FIG. 3 displays the test electronics assembly 300 shown as item 108 of FIG. 1. A printed circuit board is shown as 302. The printed circuit board includes a number of traces for providing electrical pathways through the printed circuit board 302. The printed circuit board includes wear pads 308 on the topside of the printed circuit board. The wear pads 308 may be surface mounted. The wear pads 308 serve as points of contact in the test electronics assembly 300 for making contact with the probes extending downward from higher locations in the fixture. In addition, the wear pads 308 absorb the wear to the printed circuit board 302. The wear pads 308 are positioned in a grid or matrix. In addition, the wear pads 308 are positioned close enough together so that they provide a contact point for the probes when the probes are deflected and move through an angle to an offset position as discussed above.

A configurable logic element such as a field programmable gate array (FPGA) or a complex programmable logic device (CPLD) is shown as 304. The configurable logic element is positioned on the underside of the printed circuit board 302 and in contact with the printed circuit board 302. For example, the configurable logic element may be soldered with a solder grid to the printed circuit board 302. The configurable logic elements 304 is positioned above a support plate 306. In one embodiment of the present invention the support plate 306 is made of an aluminum material. The support plate 306 supports the load of the probe forces coming downward and provides a heat sink for the configurable logic elements 304. The fixture, item 102 of FIG. 1 also makes contact with the tester electronics assembly 300 through the aluminum support plate. The tester electronics and software configures the configurable logic elements through the performance port shown as item 112 of FIG. 1.

During setup, probes may be moved and deflected from a first wear pad 308 to a second wear pad 308. When the deflection occurs, the configurable logic element 304 which once generated a test pattern or signaling through the first wear pad, may be configured to generate test patterns and signaling through the second wear pad. The configurable logic element would be reconfigured using software in the tester electronics. As a result, using the method and apparatus of the present invention, mechanical realignments may be performed using the adaptor assembly and software reconfiguration to support the mechanical realignment may be accomplished, using the test electronics assembly 300 in combination with the tester electronics (e.g. 104 of FIG. 1).

A planar view of an array of configurable logic units (e.g. item 302 of FIG. 3) is shown as item 400. In one embodiment of the present invention, each configurable logic unit 402 is 3.2 inches by 3.2 inches in dimension. In one embodiment of the present invention, configuration is accomplished by connecting the tester electronics to one column of configurable logic units 402 and then daisy chaining the configuration information to the other configurable logic units. A compact flash card is connected (e.g. not shown) to the configurable logic unit array 400 and stores configuration information. The compact flash card may be located in the test electronics assembly or in another portion of the electronic tester. In one embodiment of the present invention changes may be made locally or configuration information may be downloaded to the compact flash card from a remote location. In addition, the configuration information may be encrypted. For example, DES or triple DES decryption may be made available for each device (e.g. 56 bit keys or triple 56 bit keys may be used).

Figure 5:
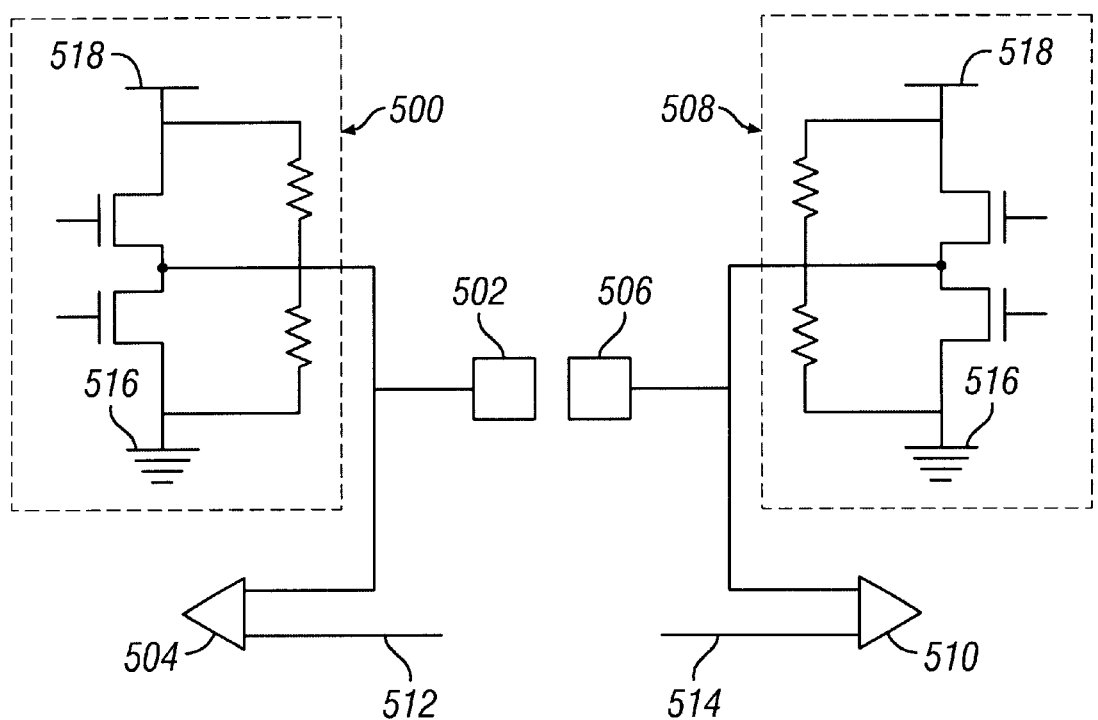
FIG. 5 displays a short testing circuit implemented in accordance with the teachings of the present invention.

FIG. 5 displays a circuit diagram for detecting shorts used in the method and apparatus of the present invention. In FIG. 5 two wear pads (502, 506) such as the wear pads shown as 308 in FIG. 3 are displayed. The two wear pads are connected to two power sources 500 and 508. Power source 500 drives wear pad 502 and power source 508 drives wear pad 506. Both power sources 500 and 508 include a positive voltage 518 and a ground shown as 516. In one embodiment of the present invention the positive voltage is about 14 volts. Therefore the output voltage to the wear pads (502, 506) would be 7.5 volts. A reference voltage is shown as 512 and 514. The reference voltage 512 as well as an output from the power source 500 serves as input to the comparator 504. The reference voltage 514 as well as an output from the power source 508 serves as input to the comparator 510. The comparator produces a logical 0 or logical 1 value as an output, depending on whether the two input are the same or different.

In the method and apparatus of the present invention, each wear pad 502 and 506 may be connected to a circuit as shown in FIG. 5. Voltage is applied to each wear pad using the power source 500 and 508. If there is a short between the wear pad 502 and the wear pad 506 the same voltage would appear on both wear pads. For example, one wear pad 502 would read 7.5 volts and a second wear pad 506 would read 7.5 volts. As a result, the comparator would produce an output of a logical 1 signifying a short.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A system comprising:
   an adapter assembly comprising,
   a first probe plate capable of holding a probe in a first position and in a second position;
   a second probe plate positioned below the first probe plate, the second probe plate capable of holding the probe in the first position and in the second position; and
   an electronics assembly interfacing with the adapter assembly, the electronics assembly comprising,
   a printed circuit board having a topside and an underside,
   a first pad coupled on the topside of the printed circuit board, the first pad positioned to make contact with the probe in the first position,
   a second pad coupled on the topside of the printed circuit board, the second pad positioned to make contact with the probe in the second position,
   a first configurable logic unit coupled to the underside of the printed circuit board, the first configurable logic unit generating signals through the printed circuit board to the first pad, when the probe is in the first position, and
   a second configurable logic unit coupled to the underside of the printed circuit board, the second configurable logic unit generating signals through the printed circuit board to the second pad, when the probe is in the second position.

2. A system comprising:
   an adapter assembly housing a plurality of probes capable of deflecting from a first position to a second position; and
   an electronics assembly interfacing with the adapter assembly, the electronics assembly comprising a plurality of configurable logic units, each of the plurality configurable logic units capable of generating a variety of test patterns for interfacing with the plurality of probes when the plurality of probes are in the first position and when the plurality of probes are in the second position.

3. A system comprising:
   an adapter assembly means for housing a plurality of probes capable of deflecting from a first position to a second position; and
   an electronics assembly means for interfacing with the adapter assembly, the electronics assembly means comprising a plurality of configurable logic means, each of the plurality configurable logic means capable of generating a variety of test patterns for interfacing with the plurality of probes when the plurality of probes are in the first position and when the plurality of probes are in the second position.

4. An assembly comprising:
   a printed circuit board having a topside and an underside;
   a first pad coupled to the topside of the printed circuit board, the first pad positioned to make contact with a probe in a first position;
   a second pad coupled to the topside of the printed circuit board, the second pad positioned to make contact with the probe in a second position; and
   a configurable logic unit coupled to the underside of the printed circuit board, the configurable logic unit generating signals through the printed circuit board to the first pad, when the probe is in the first position and generating signals through the printed circuit board to the second pad when the probe is in the second position.

* * * * *